United States Patent
Etou et al.

(10) Patent No.: US 9,639,649 B2
(45) Date of Patent: May 2, 2017

(54) SEMICONDUCTOR MEMORY DEVICE, METHOD FOR DESIGNING SEMICONDUCTOR MEMORY DEVICE, AND RECORDING MEDIUM HAVING DESIGNING METHOD RECORDED THEREIN

(71) Applicant: KABUSHIKI KAISHA TOSHIBA, Minato-ku, Tokyo (JP)

(72) Inventors: Tsuyoshi Etou, Yokohama Kanagawa (JP); Jumpei Sato, Kawasaki Kanagawa (JP); Satoshi Yamano, Yokohama Kanagawa (JP); Osamu Ooto, Kamakura Kanagawa (JP); Souichi Minemura, Yokohama Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 9 days.

(21) Appl. No.: 14/938,501

(22) Filed: Nov. 11, 2015

(65) Prior Publication Data
US 2017/0053053 A1    Feb. 23, 2017

Related U.S. Application Data

(60) Provisional application No. 62/206,718, filed on Aug. 18, 2015.

(51) Int. Cl.
| | |
|---|---|
| G11C 5/06 | (2006.01) |
| G06F 17/50 | (2006.01) |
| G11C 7/06 | (2006.01) |
| G11C 8/10 | (2006.01) |

(52) U.S. Cl.
CPC ...... *G06F 17/5072* (2013.01); *G06F 17/5077* (2013.01); *G11C 7/06* (2013.01); *G11C 8/10* (2013.01)

(58) Field of Classification Search
CPC ............ G11C 5/025; G11C 5/063; G11C 8/16
See application file for complete search history.

(56) References Cited

U.S. PATENT DOCUMENTS

| | | | | |
|---|---|---|---|---|
| 5,864,508 A | * | 1/1999 | Takashima | .......... G11C 11/4087 365/189.11 |
| 6,084,799 A | * | 7/2000 | Tanzawa | ................ G11C 16/24 365/185.05 |

(Continued)

FOREIGN PATENT DOCUMENTS

| | | |
|---|---|---|
| JP | 2004047516 A | 2/2004 |
| JP | 2011123543 A | 6/2011 |

*Primary Examiner* — Tuan T Nguyen
(74) *Attorney, Agent, or Firm* — Holtz, Holtz & Volek PC (57) ABSTRACT

According to one embodiment, a semiconductor memory device includes a core section, a corner area adjacent section, a first circuit block and a second circuit block, and multiple wiring layers. The corner area adjacent section is arranged adjacently to a corner area positioned in a corner of the core section adjacently to the sense amplifier and the row decoder. The multiple wiring layers are provided in each of the first circuit block and the second circuit block, wherein a first wire in one of the multiple wiring layers in the first circuit block is arranged parallel to a second wire included in a wiring layer in the second circuit block which is the same as the wiring layer of the first wire.

19 Claims, 6 Drawing Sheets

(56) References Cited

U.S. PATENT DOCUMENTS

| | | | |
|---|---|---|---|
| 8,964,483 B2* | 2/2015 | Kajigaya | H01L 23/498 365/189.011 |
| 2004/0006754 A1 | 1/2004 | Sonohara | |
| 2004/0013023 A1* | 1/2004 | Mori | G11C 5/143 365/226 |
| 2010/0118581 A1* | 5/2010 | Okayama | G11C 11/16 365/51 |
| 2011/0128810 A1* | 6/2011 | Sato | G06F 9/345 365/230.06 |
| 2011/0134713 A1* | 6/2011 | Givant | G11C 11/5642 365/210.1 |
| 2014/0126286 A1* | 5/2014 | Higashitani | G11C 11/5628 365/185.03 |

* cited by examiner

SEMICONDUCTOR MEMORY DEVICE, METHOD FOR DESIGNING SEMICONDUCTOR MEMORY DEVICE, AND RECORDING MEDIUM HAVING DESIGNING METHOD RECORDED THEREIN

CROSS REFERENCE TO RELATED APPLICATIONS

This application claims the benefit of U.S. Provisional Application No. 62/206,718, filed Aug. 18, 2015, the entire contents of which are incorporated herein by reference.

FIELD

Embodiments described herein relate generally to a semiconductor memory device, a method for designing the semiconductor memory device, and a recording medium having the designing method recorded therein.

BACKGROUND

In a peripheral area of a core chip of a semiconductor memory device, a large number of wires and power supply wires intersect one another.

DETAILED DESCRIPTION

In general, according to one embodiment, a semiconductor memory device includes a core section including a memory cell array, a sense amplifier adjacent to the memory cell array in a first direction, and a row decoder adjacent to the memory cell array in a second direction; a corner area adjacent section arranged adjacently to a corner area positioned in a corner of the core section where the sense amplifier and the row decoder are not arranged, the corner area being positioned adjacently to the sense amplifier and the row decoder, the corner area adjacent section being arranged opposite to the row decoder across the corner area; a first circuit block and a second circuit block provided in the corner area adjacent section to control the core section; and multiple wiring layers provided in each of the first circuit block and the second circuit block. A first wire in one of the multiple wiring layers in the first circuit block is arranged parallel to a second wire included in a wiring layer in the second circuit block which is the same as the wiring layer of the first wire.

The semiconductor memory device according to the embodiment will be described. As the semiconductor memory device, a NAND flash memory with memory cells two-dimensionally arranged on a semiconductor substrate will be described by way of example.

Figure 1:
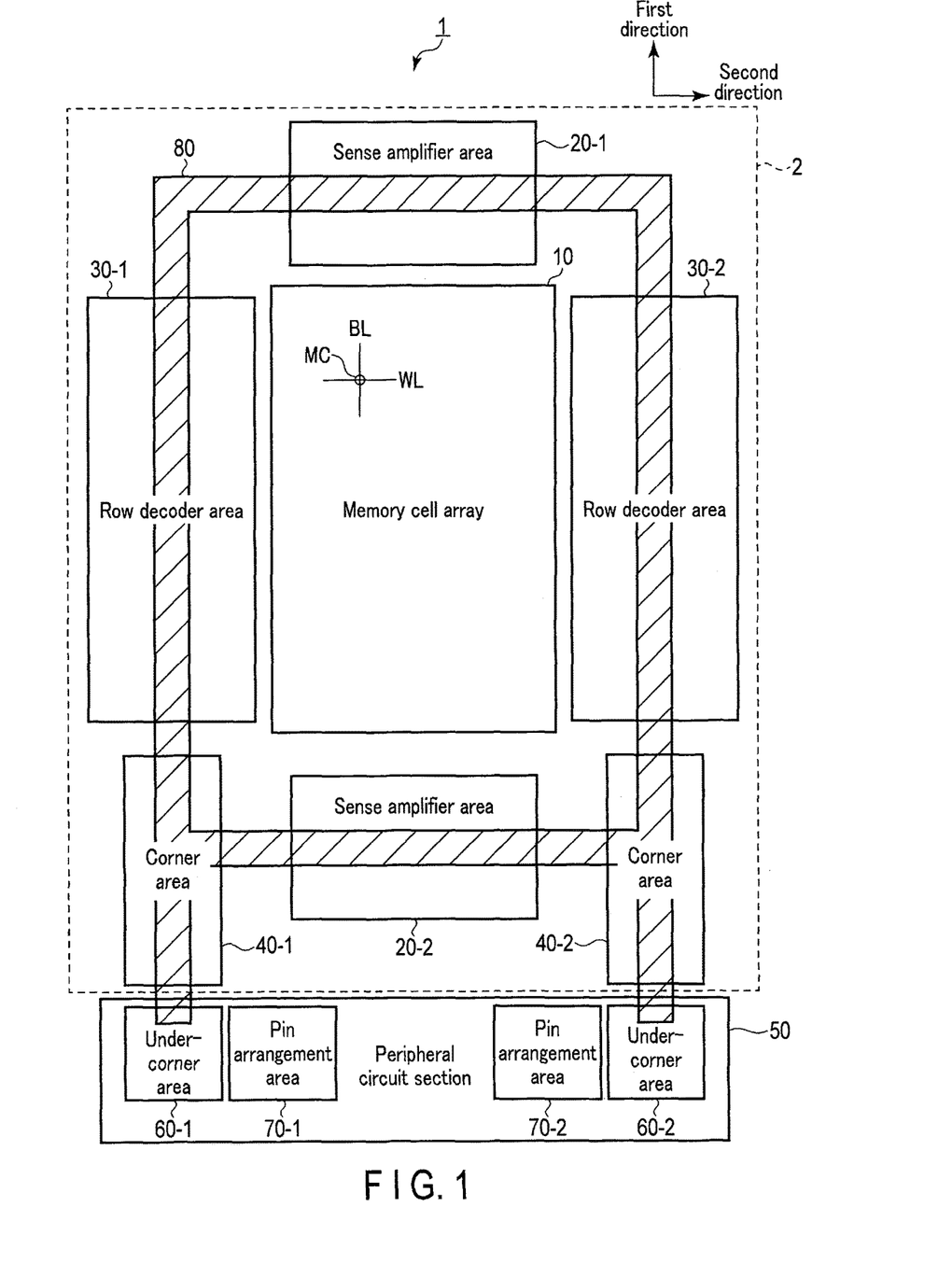
FIG. 1 is a plan view of a semiconductor memory device according to an embodiment.

First, a general configuration of a semiconductor memory device 1 according to the present embodiment will be roughly described using FIG. 1. FIG. 1 is an example of a plan view of the semiconductor memory device 1 according to the present embodiment.

The semiconductor memory device 1 includes a memory cell array 10, sense amplifier areas 20-1, 20-2, row decoder areas 30-1, 30-2, corner areas 40-1, 40-2, and a peripheral circuit section 50.

The memory cell array 10 includes memory cells of a NAND type or the like. In the memory cell array 10, bit lines BL are arranged along a first direction, and word lines WL are arranged along a second direction orthogonal to the first direction.

Each of the sense amplifier areas 20-1, 20-2 includes a sense amplifier connected to the bit lines BL and is arranged adjacently to the memory cell array 10 in the first direction. The sense amplifier areas 20-1, 20-2 are arranged so as to sandwich the memory cell array 10 between the sense amplifier areas 20-1, 20-2 along the first direction.

Each of the row decoder areas 30-1, 30-2 includes a row decoder connected to the word lines WL and is arranged adjacently to the memory cell array 10 in the second direction. The row decoder areas 30-1, 30-2 are arranged to sandwich the memory cell array 10 between the row decoder areas 30-1, 30-2 along the second direction.

As described above, the semiconductor memory device 1 includes the core section 2 including the memory cell array 10, the sense amplifier areas 20-1, 20-2 arranged adjacently to the memory cell array 10 in the first direction with respect to the memory cell array 10, the row decoder areas 30-1, 30-2 arranged adjacently to the memory cell array 10 in the second direction with respect to the memory cell array 10, and the corner areas 40-1, 40-2. The corner areas 40-1, 40-2 may be provided either in the peripheral circuit section 50 or in the core section 2.

The corner area 40-1 is positioned in a corner of the core section 2 where neither the sense amplifier areas 20-1, 20-2 nor the row decoder areas 30-1, 30-2 are arranged, so as to lie adjacently to the sense amplifier area 20-2 and the row decoder area 30-1. Similarly, the corner area 40-2 is positioned in a corner of the core section 2 where neither the sense amplifier areas 20-1, 20-2 nor the row decoder areas 30-1, 30-2 are arranged, so as to lie adjacently to the sense amplifier area 20-2 and the row decoder area 30-2.

FIG. 1 omits illustration of a corner area adjacent to the sense amplifier area 20-1 and the row decoder area 30-1 and a corner area adjacent to the sense amplifier area 20-1 and the row decoder area 30-2. However, the corner areas in the present embodiment may include these corner areas not depicted in the drawings.

Furthermore, in FIG. 1, the corner areas 40-1, 40-2 are depicted to have a rectangular shape but may have any other shape such as a square.

The corner areas 40-1, 40-2 include, for example, circuits for controlling the core section 2.

On the other hand, the peripheral circuit section 50 is arranged in a peripheral area of the semiconductor memory device 1.

The peripheral circuit section 50 includes under-corner areas 60-1, 60-2 and pin arrangement areas 70-1, 70-2. Besides the under-corner areas 60-1, 60-2 and pin arrangement areas 70-1, 70-2, the peripheral circuit section 50 may include, for example, an area where a power supply is arranged which supplies internal power for the semiconductor memory device 1 and an area including drivers for the core section 2 with the sense amplifier areas 20-1, 20-2, the row decoder areas 30-1, 30-2, and the like, though these areas are not depicted in the drawings.

The under-corner area 60-1 includes, for example, cell blocks 61 described below with reference to FIG. 2. The under-corner area 60-1 is arranged adjacently to the corner area 40-1 and opposite to the row decoder area 30-1 across the corner area 40-1. In such a plan view as depicted in FIG. 1, the under-corner area 60-1 is depicted to lie immediately below the corner area 40-1. Furthermore, in FIG. 1, the corner area 40-1 and the peripheral circuit section 50 do not intersect each other, but for example, the corner areas 40-1, 40-2 may be partly included in the peripheral circuit section 50. In such a case, the under-corner area 60-1 is an area where the corner area 40-1 and the peripheral circuit section 50 intersect each other and which is also referred to as a root of the corner area 40-1.

Similarly, the under-corner area 60-2 includes, for example, the cell blocks 61 described below with reference to FIG. 2. The under-corner area 60-2 is also arranged adjacently to the corner area 40-2 and opposite to the row decoder area 30-2 across the corner area 40-2. In such a plan view as depicted in FIG. 1, the under-corner area 60-2 is depicted to lie immediately below the corner area 40-2. Furthermore, in FIG. 2, the corner area 40-2 and the peripheral circuit section 50 do not intersect each other, but for example, the corner areas 40-1, 40-2 may be partly included in the peripheral circuit section 50. In such a case, the under-corner area 60-2 is an area where the corner area 40-2 and the peripheral circuit section 50 intersect each other and which is also referred to as a root of the corner area 40-2.

The pin arrangement area 70-1 is an area located adjacently to the under-corner area 60-1 and where pins for I/O wires allowing for inputs to and outputs from the cell blocks 61 described below (in other words, I/O pads) are arranged with given regularity. Similarly, the pin arrangement area 70-2 is an area located adjacently to the under-corner area 60-2 and where pins for I/O wires allowing for inputs to and outputs from the cell blocks 61 described below are arranged with given regularity.

The under-corner area 60-2 of the under-corner areas 60-1, 60-2 will be described below, but the same description also applies to the under-corner area 60-1.

Furthermore, the memory cell array 10, the sense amplifier areas 20-1, 20-2, the row decoder areas 30-1, 30-2, the corner areas 40-1, 40-2, and the peripheral circuit section 50 are connected together, for example, via a metal wiring layer 80 including power supply wires. In FIG. 1, a shaded area depicts the metal wiring layer 80. Additionally, the semiconductor memory device 1 may include a wiring layer other than the metal wiring layer 80. However, the wiring layers other than the metal wiring layer 80 are omitted from FIG. 1.

Now, with reference to FIG. 2, a configuration example of the under-corner area 60-2 in the present embodiment will be described.

The under-corner area 60-2 includes cell blocks 61A, 61B, 61C, power supply wires 62-1, 62-2, power supply wires 63-1, 63-2, through wire groups 64-1, 64-2, through wire groups 65-1, 65-2, I/O wire groups 66-1, 66-2, and I/O wire groups 67-1, 67-2. The power supply wires 62-1, 62-2, the through wire groups 64-1, 64-2, and the I/O wire groups 66-1, 66-2, 66-3, 66-4 are formed of, for example, a first metal wiring layer. The power supply wires 63-1, 63-2, the through wire groups 65-1, 65-2, and the I/O wire groups 67-1, 67-2 are formed of a second metal wiring layer positioned above the first metal wiring layer.

Figure 2:
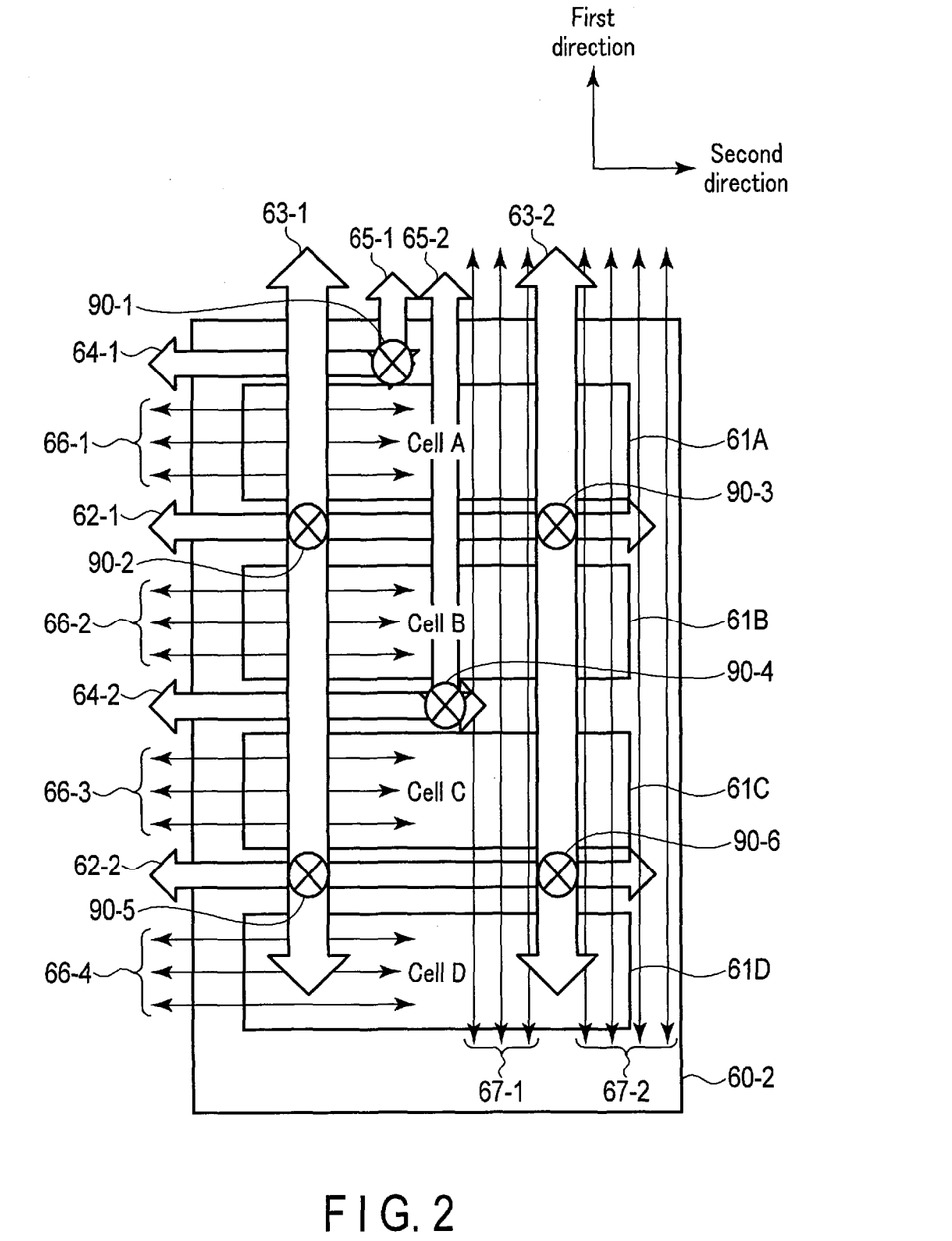
FIG. 2 is a diagram depicting an example of a configuration of a peripheral circuit section of the semiconductor memory device according to the embodiment.

FIG. 2 depicts the four cell blocks 61A, 613, 61C, 61D. However, the present embodiment is not limited to the four cell blocks but may include, for example, one, two, three, four, or more cell blocks. Furthermore, for each of the sets of the power supply wires 62-1, 62-2, the power supply wires 63-1, 63-2, the through wire groups 64-1, 64-2, the through wire groups 65-1, 65-2, the I/O wire groups 66-1, 66-2, and the I/O wire groups 67-1, 67-2, one or more wires may be provided.

Each of the cell blocks 61A, 61B, 61C, 61D is a circuit (cell) block including a circuit or the like including transistors or the like for controlling the core section 2, and is a functional block having a certain function. Each of the cell blocks is, for example, a row control cell block for controlling the row decoders and the like, a column control cell block for controlling the sense amplifiers and the like, or a generator block related to an internal power supply for the semiconductor memory device 1.

More specifically, each of the cell blocks 61A, 61B, 61C, 61D includes a control circuit, a generator circuit, or the like. Moreover, each of the cell blocks 61A, 61B, 61C, 61D includes internal cell wires including an intra-cell wire for connecting the control circuits together or the generator circuits together or an intra-cell I/O wire allowing for inputs to and outputs from the cell block.

Furthermore, each of the cell blocks 61A, 61B, 61C, 61D includes multiple wiring layers. In this case, an internal cell wire (hereinafter referred to as the "first internal cell wire") included in one of the multiple wiring layers in one of the cell blocks 61A, 61B, 61C, 61D (hereinafter referred to as the "first cell block") is arranged parallel to an internal cell wire (hereinafter referred to as the "second internal cell wire") included in the same wiring layer as the wiring layer of the first internal cell wire, in a cell block 61 different from the one of the cell blocks 61A, 61B, 61C, 61D (hereinafter referred to as the "second cell block"). This will be specifically described with reference to FIG. 4, FIG. 7, and the like.

A case is assumed below where each cell block includes two wiring layers, that is, a first metal wiring layer and a second metal wiring layer. Furthermore, a case will be described below where the wire included in the first metal wiring layer in the under-corner area 60-2 is arranged along the second direction and where the wire included in the second metal wiring layer in the under-corner area 60-2 is arranged along the first direction.

Furthermore, in FIG. 2, the cell blocks 61A, 61B, 61C, 61D are arranged in this order along the first direction. That is, the cell blocks 61A, 61E, 61C, 61D are arranged in this order in order of increasing distance from the core section 2.

Each of the power supply wires 62-1, 62-2 is a power supply wire arranged in the under-corner area 60-2. The power supply wires 62-1, 62-2 are connected to other areas of the peripheral circuit section 50 such as the pin arrangement area 70-2 in order to, for example, allow power to be transmitted to these other areas.

Arrows for the wires in FIG. 2 indicate transmission and reception or input and output of signals.

Furthermore, the power supply wires 62-1, 62-2 are arranged between the cell blocks 61. In FIG. 2, the power supply wire 62-1 is arranged between the cell block 61A and the cell block 61B. The power supply wire 62-2 is arranged between the cell block 61C and the cell block 61D.

Moreover, each of the power supply wires 62-1, 62-2 is connected to the power supply wire 63 via a via connection 90 for connecting the first metal wiring layer and the second metal wiring layer together. In FIG. 2, the power supply wire 62-1 is connected to the power supply wire 63-1 via a via connection 90-2. Furthermore, the power supply wire 62-1 is connected to the power supply wire 63-2 via a via connection 90-3. Similarly, the power supply wire 62-2 is connected to the power supply wire 63-1 via a via connection 90-5. Furthermore, the power supply wire 62-2 is connected to the power supply wire 63-2 via a via connection 90-6.

Each of the power supply wires 63-1, 63-2 is a power supply wire arranged in the second metal wiring layer in the under-corner area 60-2, and is connected to other areas such as the corner area 40-2 and the core section 2 in order to, for example, allow power to be transmitted to these other areas.

Each of the through wire groups 64-1, 64-2 is a wiring group arranged in the first metal wiring layer in the under-corner area 60-2, and which does not allow for inputs to the first cell block or the second cell block or for outputs to the first cell block or the second cell block, that is, which passes through the first cell block and the cell block instead of being electrically connected to the first cell block and the second cell block.

For example, the through wire groups 64-1, 64-2 are wiring groups through which signals are transmitted and received between the core section 2 and, for example, circuits in the peripheral circuit section 50 other than the cell blocks 61.

Furthermore, each of the through wire groups 64-1, 64-2 is arranged between the first cell block and the second cell block. In FIG. 2, the through wire group 64-2 is arranged between the cell block 61C and the cell block 61D. On the other hand, the through wire group 64-1 is arranged adjacently to the cell block 61A. In this manner, when the second cell block is not present, the through wire group 64 is arranged, for example, adjacently to the cell block 61A, which is the first cell block. Also for the above-described power supply wires 62, when the second cell block is absent, the power supply wire 62 may be arranged, for example, adjacently to the first cell block.

Moreover, each of the through wire groups 64-1, 64-2 is connected to a through wire 65 via the via connection 90. In FIG. 2, a through wire 64-1 is connected to a through wire 65-1 via a via connection 90-1. Similarly, a through wire 64-2 is connected to a through wire 65-4 via a via connection 90-4.

Through wires 65-1, 65-2 are each a through wire arranged in the second metal wiring layer in the under-corner area 60-2 and which does not allow for inputs to the first cell block or the second cell block or for outputs to the first cell block or the second cell block but which passes through the first cell block and the second cell block. The through wires 65-1, 65-2 may be through wire groups each including a plurality of wires.

Each of the I/O wire groups 66-1, 66-2, 66-3, 66-4 is an I/O wire group arranged in the first metal wiring layer in the under-corner area 60-2 and allowing for inputs to and outputs from the first cell block and the second cell block, that is, electrically connected to the first cell block and the second cell block.

Furthermore, each of the I/O wire groups 66-1, 66-2, 66-3, 66-4 allows for inputs to and outputs from the first cell block and the second cell block in a direction orthogonal to the direction in which the first cell block and the second cell block are arranged. In FIG. 2, the direction in which the first cell block and the second cell block are arranged is a direction along the first direction.

For example, the I/O wire group 66-1 allows for inputs to and outputs from the cell block 61A along the second direction orthogonal to the first direction. That is, the I/O wire group 66-1 is laid out within a range indicative of a position corresponding to the cell block 61A in the first direction and is connected to (allows for inputs to and outputs from) the cell block 61A.

A position corresponding to each cell block 61, each power supply wire 62, each through wire group 64, or each I/O wire group 66 in the first direction is hereinafter referred to as a "first direction position".

Furthermore, a position corresponding to each cell block 61, each power supply wire 63, each through wire 65, or each I/O wire group 67 in the second direction is hereinafter referred to as a "second direction position".

Each of the I/O wire groups 67-1, 67-2 is an I/O wire group arranged in the second metal wiring layer in the under-corner area 60-2 and connected to the corner area 40-2 to allow the corner area 40-2 to provide inputs to and receive outputs from the under-corner area 60-2. More specifically, each of the I/O wire groups 67-1, 67-2 is an I/O wire group that allows for inputs to and outputs from each of the first and second cell blocks.

Furthermore, each of the I/O wire groups 67-1, 67-2 is routed from the corner area 40-2 toward the first cell block or the second cell block without returning toward the corner area 40-2.

FIG. 2 illustrates that the I/O wire group 67-1 includes three I/O wires and that the I/O wire group 67-2 includes four I/O wires. However, each of the I/O wire groups 67-1, 67-2 may include an I/O wire group with two or more I/O wires or include only one I/O wire. Furthermore, in FIG. 2, the power supply wire 63-2 is arranged between the I/O wire group 67-1 and the I/O wire group 67-2. However, the I/O wire groups 67-1, 67-2 may be adjacent to each other.

Next, a method for designing the NAND flash memory will be described with reference to FIG. 3, focusing particularly on the cell blocks 61 in the under-corner area 60-2 and a placement procedure for the wires as described above. The designing method described below is executed by a computer or the like using, for example, a circuit designing tool. The circuit designing tool executes a program for which the arrangement method is recorded in a recording medium such as a magnetic disk to implement the following designing method.

First, the designing tool temporarily places the cell blocks 61 in the under-corner area 60-2 (step S30). Specifically, the first internal cell wire and the second internal cell wire are placed parallel to each other. Furthermore, the cell blocks 61A, 61B, 61C, 61D are placed in this order, for example, in order of increasing distance from the core section 2. Additionally, the positions of the cell blocks 61 set in step S30 may further be adjusted in any of subsequent steps S32, S34, S36.

Then, the power supply wires are positioned (step S32). For example, the power supply wires 62-1, 62-2 are positioned so as to each lie between the cell blocks 61. Furthermore, the positions of the power supply wires set in step S32 may further be adjusted in the subsequent step S34 or S36.

Then, the through wire groups are positioned (step S34). For example, the through wire groups 64-1, 64-2 are positioned so as to each lie between the cell blocks 61. Furthermore, the positions of the through wire groups set in step S34 may further be adjusted in the subsequent step S36.

Then, the wiring group used in each cell block 61, that is, the input wiring group allowing inputs to and outputs from each cell block is positioned (step S36). For example, the I/O wire groups 66-1, 66-2, 66-3, 66-4 are positioned so as to allow for inputs to and outputs from the first cell block and the second cell block in the direction orthogonal to the direction in which the first cell block and the second cell block are arranged.

Figure 3:
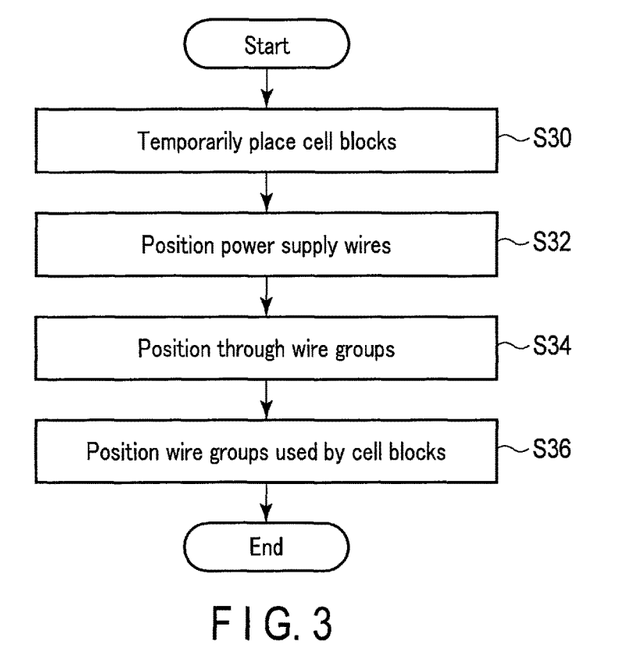
FIG. 3 is a flowchart illustrating an example of a placement procedure for placing cell blocks and wires in the peripheral circuit section of the semiconductor memory device according to the embodiment.

The placement procedure illustrated in FIG. 3 is an example, and after execution of the processing in step S30, the processing in step S34 may be executed and then the processing in step S32 and the processing in step S36 may be carried out.

Now, with reference to FIG. 4 to FIG. 7, steps described with reference to FIG. 3 will be described in further detail.

First, with reference to FIG. 4, step S30 will be described in further detail.

Figure 4:
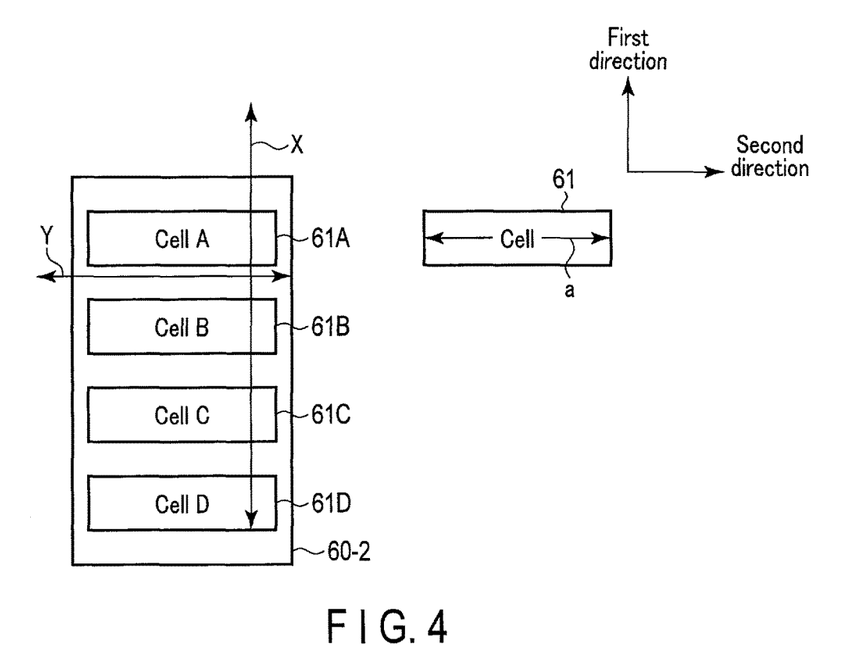
FIG. 4 is a diagram schematically illustrating an example of a placement procedure for cell blocks in the placement procedure illustrated in FIG. 3.

FIG. 4 is a diagram schematically illustrating the processing in step S30. With reference to FIG. 4, a case will be described where the cell blocks 61A, 61B, 61C, 61D are placed in the under-corner area 60-2.

Arrow X extends along the first direction and indicates a direction in which the wires included in the second metal wiring layer in the under-corner area 60-2 are arranged (hereinafter referred to as an "M2 direction"). On the other hand, arrow Y corresponds to the second direction and indicates a direction in which the wires included in the first metal wiring layer in the under-corner area 60-2 are arranged (hereinafter referred to as an "M1 direction").

Furthermore, arrow (a) indicates a direction in which a wire of the above-described internal cell wires which is included in the first metal wiring layer in each cell block 61 (hereinafter referred to as an "M1 internal cell wire") is arranged. Arrow (a) indicates, in FIG. 4, a longitudinal direction of each cell block 61 but is not limited to this longitudinal direction.

A case will be described where the cell blocks 61A, 61B, 61C, 61D have the same shape and where the M1 internal cell wires in the cell blocks 61 are routed in the same direction. The cell blocks 61 are not limited to the same shape.

The M1 internal cell wires in the cell blocks 61 are placed parallel to one another. For example, first, the M1 internal cell wire in the cell block 61A and the M1 internal cell wire in the cell block 61B are placed parallel to each other. Then, the M1 internal cell wire in the cell block 61A or the cell block 615 and the M1 internal cell wire in the cell block 61C are placed parallel to each other. Then, the M1 internal cell wire in one of the cell blocks 61A, 61B, 61C and the M1 internal cell wire in the cell block 61D are placed parallel to each other.

In FIG. 4, the direction of the M1 internal cell wires and the M1 direction depicted by arrow Y are depicted to be the same. However, these directions need not necessarily be the same.

Furthermore, as depicted in FIG. 4, the cell blocks 61A, 61B, 61C, 61D may be placed in this order in order of increasing distance from the core section 2. For example, the cell block 61A is placed close to the core section 2, and then, the cell block 61B is placed. Subsequently, the cell block 61C is placed, and then, the cell block 61D is placed.

Now, step 32 will be described in further detail with reference to FIG. 5.

Figure 5:
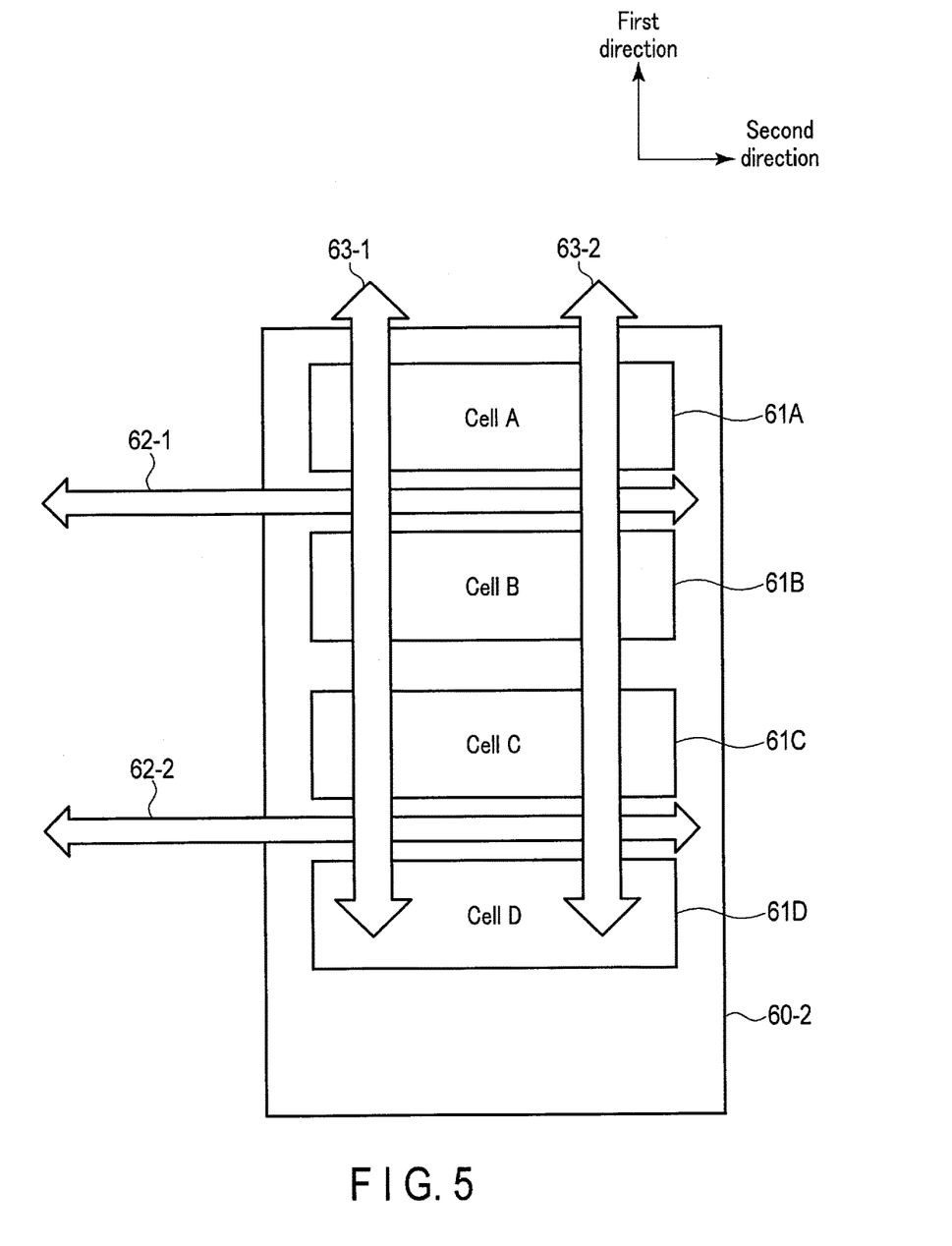
FIG. 5 is a diagram schematically illustrating an example of a placement procedure for power supply wires in the placement procedure illustrated in FIG. 3.

FIG. 5 is a diagram schematically illustrating the processing in step S32.

First, the power supply wires 62-1, 62-2 are positioned for placement between the cell blocks 61 temporarily placed in step S30. For example, in regard to the above-described first direction positions, the power supply wire 62-1 is determined to be positioned between the position of the cell block 61A and the position of the cell block 61B. Similarly, in regard to the above-described first direction positions, the power supply wire 62-2 is determined to be positioned between the position of the cell block 61C and the position of the cell block 61D. Then, the power supply wires 62-1, 62-2 are placed at the determined positions.

Figure 6:
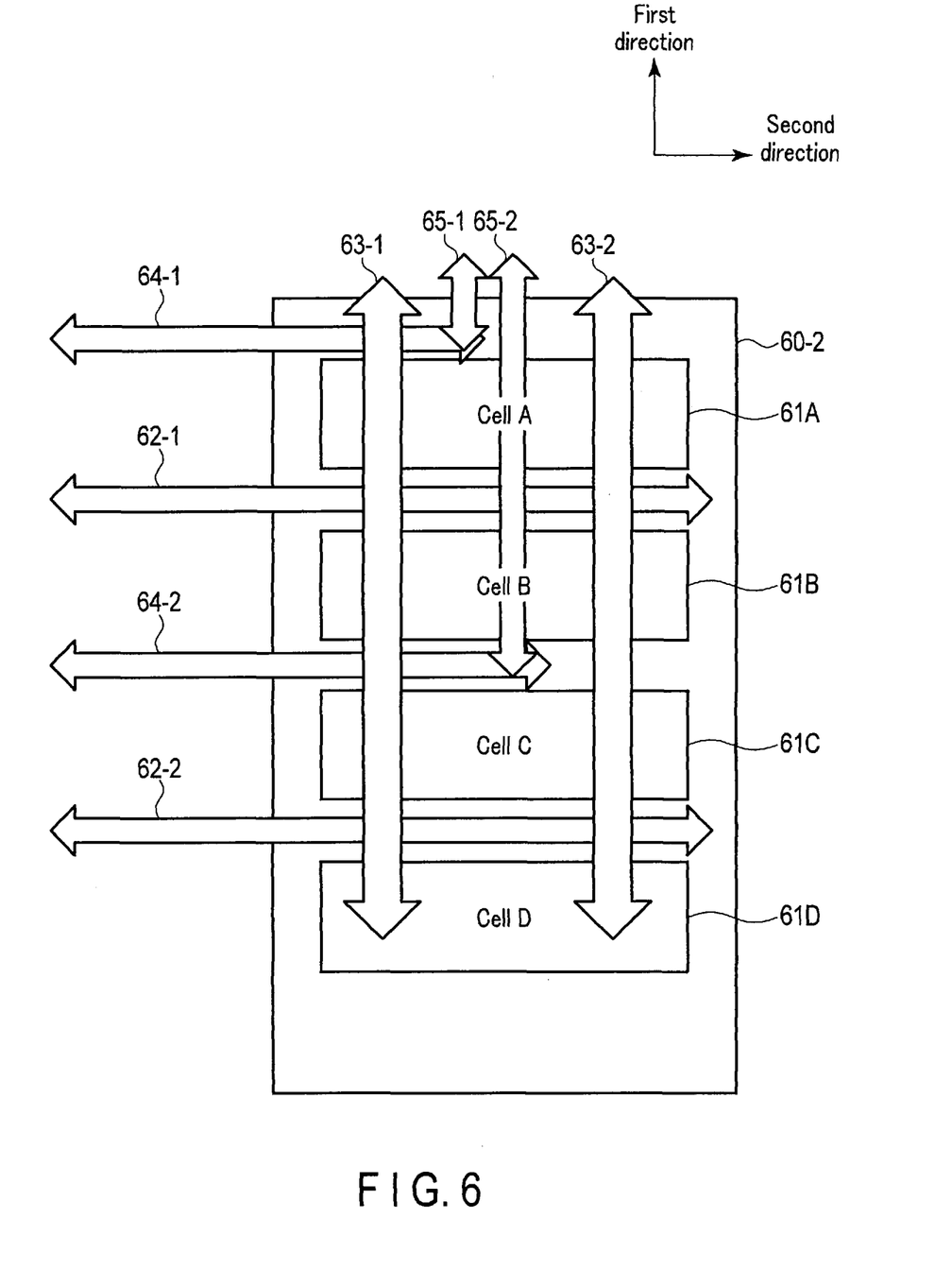
FIG. 6 is a diagram schematically illustrating an example of a placement procedure for through lines in the placement procedure illustrated in FIG. 3.
Figure 7:
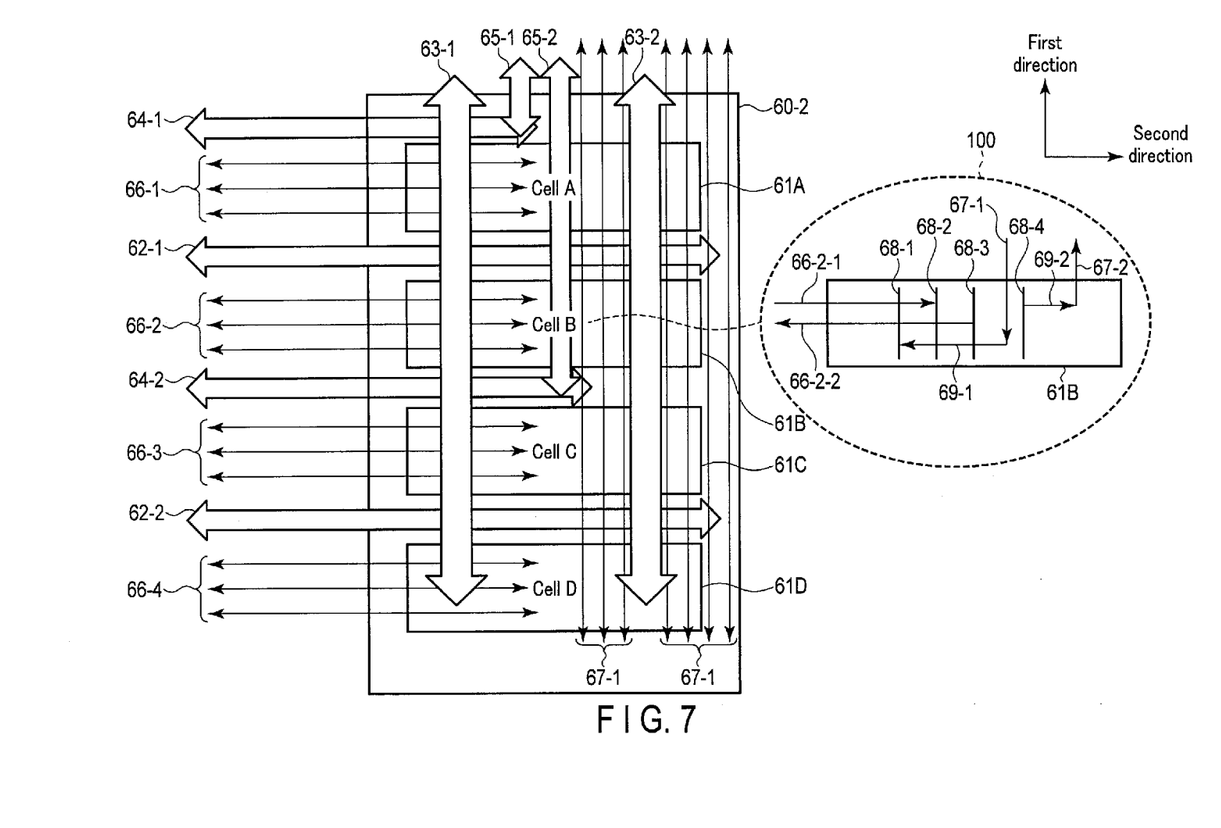
FIG. 7 is a diagram schematically illustrating an example of a placement procedure for I/O wires in the placement procedure illustrated in FIG. 3.

The present embodiment is described on the assumption of a case where the positions of the power supply wires 63-1, 63-2, the through wires 65-1, 65-2, and the I/O wire groups 67-1, 67-2 related to the second direction positions as depicted in FIGS. 5 to 7 are predetermined.

In this manner, in the first metal wiring layer in the under-corner area 60-2, the power supply wires 62-1, 62-2 are placed in spaces different from areas used by the cell blocks 61.

Now, with reference to FIG. 6, step S34 will be described in further detail.

FIG. 6 is a diagram schematically illustrating the processing in step S34.

First, the through wire groups 64-1, 64-2 are positioned for placement between the cell blocks 61 placed in step S30. For example, in regard to the first direction positions, the position of the through wire group 64-1 is determined to be adjacent to the cell block 61A and closer to the core section 2 than the position of the cell block 61A. Similarly, in regard to the first direction positions, the position of the through wire group 64-2 is determined to be between the position of the cell block 61B and the position of the cell block 61C. Then, the through wire groups 64-1, 64-2 are placed at the respective determined positions.

The placed through wire groups 64-1, 64-2 are connected to the through wires 65-1, 65-2 at the predetermined positions of the through wires 65-1, 65-2 related to the second direction positions.

In this manner, in the first metal wiring layer in the under-corner area 60-2, the through wires 65-1, 65-2 are placed in spaces different from areas used by the cell blocks 61 and the power supply wires 62-1, 62-2.

Now, with reference to FIG. 7, step S36 will be described in further detail.

FIG. 7 is a diagram schematically illustrating the processing in step S36.

First, for the cell blocks 61 placed in step S30, the I/O wire groups 66-1, 66-2, 66-3, 66-4 are positioned for placement within the ranges, in the first direction, of the cell blocks 61 determined by the above-described first direction positions.

For example, in regard to the first direction positions, the position of the I/O wire group 66-1 is determined to be a position within the range of the cell block 61A indicative of the first direction position. Similarly, in regard to the first direction positions, the position of the I/O wire group 66-2 is determined to be a position within the range of the cell block 61B indicative of the first direction position. Furthermore, in regard to the first direction positions, the position of the I/O wire group 66-3 is determined to be a position within the range of the cell block 61C indicative of the first direction position. Moreover, in regard to the first direction positions, the position of the I/O wire group 66-4 is determined to be a position within the range of the cell block 61D indicative of the first direction position.

Then, the I/O wire groups 66-1, 66-2, 66-3, 66-4 are placed at the determined positions of the I/O wire groups 66-1, 66-2, 66-3, 66-4.

The I/O wire groups 66-1, 66-2, 66-3, 66-4 may be placed, for example, in this order but may be placed in any order.

Now, the I/O wire group 66-2 allowing for inputs to and outputs from the cell block 61B will be described in further detail. A similar description also applies to the other cell blocks 61A, 61C, 61D.

As depicted in a detailed diagram 100 of the cell block 61B in FIG. 7, the cell block 61B includes, for example, circuits 68-1, 68-2, 68-3, 68-4 such as transistors and internal cell wires 69-1, 69-2 in the M1 direction of the cell block 61B.

For example, the internal cell wire 69-1 is connected to the circuit 68-1, and the internal cell wire 69-2 is connected to the circuit 68-4.

Arrow directions of the wires in the detailed diagram 100 of the cell block 61B are indicative of, for example, I/O directions of signals. Furthermore, in the detailed diagram 100 of the cell block 61B, longitudinal directions of the circuits 68-1, 68-2, 68-3, 68-4 are set to be the same as the first direction. However, the longitudinal directions need not necessarily be the same as the first direction. Additionally, the circuits 68-1, 68-2, 68-3, 68-4 are arranged, for example, below the first metal wiring layer.

For example, an input wire 66-2-1 included in the I/O wire group 66-2 is placed so as to allow for inputs to the circuit 68-2 in the cell block 61B along the second direction. On the other hand, an output wire 66-2-2 included in the I/O wire group 66-2 is placed so as to allow for outputs from the circuit 68-3 in the cell block 61B along the second direction.

Furthermore, the internal cell wire 69-1 is, for example, connected to one of the input wires in the I/O wire group 67-1 and placed such that signals are input to the circuit 68-1 through the input wire in the I/O wire group 67-1. On the other hand, the internal cell wire 69-2 is, for example, connected to one of the output wires in the I/O wire group 67-2 and placed such that signals are output from the circuit 68-4 through the output wire in the I/O wire group 67-2.

As described above, the configuration according to the present embodiment enables effective utilization of the peripheral area where a large number of wires and power supply wires on the core chip of the semiconductor memory device 1 intersect one another. For example, the cell blocks 61 including normal circuits with transistors can be arranged in the under-corner area 60. Thus, for example, free spaces that are not conventionally used can be effectively utilized, enabling the cell blocks 61 to be more efficiently arranged in the peripheral circuit section 50 and the like. Therefore, the size of the peripheral circuit section 50 can be reduced, with the result that the chip size of the semiconductor memory device 1 can be reduced. For example, for the length of the peripheral circuit section 50 in the first direction, a size corresponding to approximately 10 micrometers can be reduced.

Furthermore, in the present embodiment, circuits for controlling the core section 2 can be arranged in the under-corner area 60 in the peripheral circuit section 50, which is positioned close to the core section 2. Thus, the resistance of the wiring to the core section 2 can be reduced, enabling the performance of the semiconductor memory device 1 to be improved.

Furthermore, in the present embodiment, the first internal cell wire and the second internal cell wire are arranged parallel to each other. Thus, for example, in the peripheral area where a large number of wires and power supply wires intersect one another, the wires and the like can be prevented from being short-circuited.

Furthermore, in the present embodiment, even when the cell blocks 61 are arranged, spaces for the power supply wires 62, the through wire groups 64, and the like can be provided. Additionally, for example, the I/O wire groups 66 are arranged within the ranges indicating the positions corresponding to the cell blocks 61 in the first direction to enable the I/O wire groups 67 to be routed from the corner area 40 toward the cell blocks 61 without returning toward the corner area 40.

In addition, in the present embodiment, the pin arrangement area 70 is arranged adjacently to the under-corner area 60 to enable optional positioning of the pins for the I/O wires allowing inputs to and outputs from the cell blocks 61. Thus, for example, the I/O wire groups 66-1, 66-2, 66-3, 66-4 can be easily placed.

The above-described embodiment is not the only embodiment but various modifications may be made to the embodiment. For example, in the above-described embodiment, the metal wiring layer includes the first metal wiring layer and the second metal wiring layer by way of example. However, the metal wiring layer may include a third and higher metal wiring layers or may omit the first metal wiring layer. Furthermore, in the above-described embodiment, the NAND flash memory has been described by way of example. However, the present embodiment is applicable to other semiconductor memories and widely applicable to configurations of even LSIs other than semiconductor memories which have similar objects to be accomplished.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a core section comprising a memory cell array, a sense amplifier adjacent to the memory cell array in a first direction, and a row decoder adjacent to the memory cell array in a second direction;
a corner area adjacent section arranged adjacently to a corner area positioned in a corner of the core section adjacently to the sense amplifier and the row decoder, the corner area adjacent section being arranged opposite to the row decoder across the corner area;
a first circuit block and a second circuit block provided in the corner area adjacent section to control the core section; and
multiple wiring layers provided in each of the first circuit block and the second circuit block,
wherein a first wire in one of the multiple wiring layers in the first circuit block is arranged parallel to a second wire included in a wiring layer in the second circuit block which is the same as the wiring layer of the first wire.

2. The device according to claim 1, further comprising a power supply wire for supplying power to the semiconductor memory device,
wherein the power supply wire is arranged between the first circuit block and the second circuit block.

3. The device according to claim 1, further comprising a through wire passing through the first circuit block and the second circuit block instead of being electrically connected to the first circuit block and the second circuit block,
wherein the through wire is arranged between the first circuit block and the second circuit block.

4. The device according to claim 1, further comprising an I/O wire electrically connected to each of the first circuit block and the second circuit block,
wherein the I/O wire allows for inputs to and outputs from the first circuit block and the second circuit block in a direction orthogonal to a direction in which the first circuit block and the second circuit block are arranged.

5. The device according to claim 1, further comprising a third wire routed from the corner area toward the corner area adjacent section,
wherein the third wire is routed from the corner area toward the first circuit block or the second circuit block without returning toward the corner area.

6. The device according to claim 1, wherein the multiple wiring layers comprise a first wiring layer and a second wiring layer above the first wiring layer,
wherein the first wire and the second wire are included in the first wiring layer.

7. The device according to claim 1, further comprising a pin arrangement area located adjacently to the corner area adjacent section and in which a pin for the I/O wire allowing for inputs to and outputs from the first circuit block and the second circuit block is arranged.

8. A method for designing a semiconductor memory device, the method comprising:
placing a core section comprising a memory cell array, a sense amplifier adjacent to the memory cell array in a first direction, and a row decoder adjacent to the memory cell array in a second direction;
placing a corner area adjacent section adjacently to a corner area positioned in a corner of the core section adjacently to the sense amplifier and the row decoder so as to place the corner area adjacent section opposite to the row decoder across the corner area;
placing, in the corner area adjacent section, a first circuit block and a second circuit block for controlling the core section;
placing multiple wiring layers in each of the first circuit block and the second circuit block; and
placing a first wire in one of the multiple wiring layers in the first circuit block parallel to a second wire included in a wiring layer in the second circuit block which is the same as the wiring layer of the first wire.

9. The method according to claim 8, further comprising placing a power supply wire for supplying power to the semiconductor memory device, between the first circuit block and the second circuit block.

10. The method according to claim 8, further comprising placing, between the first circuit block and the second circuit block, a through wire passing through the first circuit block and the second circuit block instead of being electrically connected to the first circuit block and the second circuit block.

11. The method according to claim 8, further comprising placing an I/O wire electrically connected to each of the first circuit block and the second circuit block such that the I/O wire allows for inputs to and outputs from the first circuit block and the second circuit block in a direction orthogonal to a direction in which the first circuit block and the second circuit block are arranged.

12. The method according to claim 8, further comprising placing a third wire routed from the corner area toward the corner area adjacent section such that the third wire is routed from the corner area toward the first circuit block or the second circuit block without returning toward the corner area.

13. The method according to claim 8, further comprising placing a pin arrangement area adjacently to the corner area adjacent section, a pin for the I/O wire allowing for inputs to and outputs from the first circuit block and the second circuit block being arranged in the pin arrangement area.

14. A nontransitory computer-readable recording medium having code recorded thereon for designing a semiconductor memory device, the code comprising:
a code for allowing a computer to place a core section comprising a memory cell array, a sense amplifier adjacent to the memory cell array in a first direction, and a row decoder adjacent to the memory cell array in a second direction;
a code for allowing the computer to place a corner area adjacent section adjacently to a corner area positioned in a corner of the core section adjacently to the sense amplifier and the row decoder so as to place the corner area adjacent section opposite to the row decoder across the corner area;
a code for allowing the computer to place, in the corner area adjacent section, a first circuit block and a second circuit block for controlling the core section; and
a code for allowing the computer to place multiple wiring layers in each of the first circuit block and the second circuit block; and
a code for allowing the computer to place a first wire in one of the multiple wiring layers in the first circuit block parallel to a second wire included in a wiring layer in the second circuit block which is the same as the wiring layer of the first wire.

15. The recording medium according to claim 14, the recording medium further comprising:
a code for allowing the computer to place a power supply wire for supplying power to the semiconductor memory device, between the first circuit block and the second circuit block.

16. The recording medium according to claim 14, the recording medium further comprising:
a code for allowing the computer to place, between the first circuit block and the second circuit block, a through wire passing through the first circuit block and the second circuit block instead of being electrically connected to the first circuit block and the second circuit block.

17. The recording medium according to claim 14, the recording medium further comprising:
a code for allowing the computer to place an I/O wire electrically connected to each of the first circuit block and the second circuit block such that the I/O wire allows for inputs to and outputs from the first circuit block and the second circuit block in a direction orthogonal to a direction in which the first circuit block and the second circuit block are arranged.

18. The recording medium according to claim 14, the recording medium further comprising:
- a code for allowing the computer to place a third wire routed from the corner area toward the corner area adjacent section such that the third wire is routed from the corner area toward the first circuit block or the second circuit block without returning toward the corner area.

19. The recording medium according to claim 14, the recording medium further comprising:
- a code for allowing the computer to place a pin arrangement area adjacently to the corner area adjacent section, a pin for the I/O wire allowing for inputs to and outputs from the first circuit block and the second circuit block being arranged in the pin arrangement area.

\* \* \* \* \*